(12) United States Patent
Wong et al.

(10) Patent No.: US 11,107,754 B2
(45) Date of Patent: Aug. 31, 2021

(54) ELECTRONIC DEVICE, LEADFRAME FOR AN ELECTRONIC DEVICE AND METHOD FOR FABRICATING AN ELECTRONIC DEVICE AND A LEADFRAME

(71) Applicant: Infineon Technologies AG, Neubiberg (DE)

(72) Inventors: Jia Yi Wong, Melaka (MY); Kar Meng Ho, Ipoh (MY)

(73) Assignee: Infineon Technologies AG, Neubiberg (DE)

( * ) Notice: Subject to any disclaimer, the term of this patent is extended or adjusted under 35 U.S.C. 154(b) by 150 days.

(21) Appl. No.: 16/007,154

(22) Filed: Jun. 13, 2018

(65) Prior Publication Data

US 2018/0358287 A1    Dec. 13, 2018

(30) Foreign Application Priority Data

Jun. 13, 2017 (DE) .................... 10 2017 209 904.6

(51) Int. Cl.
   *H01L 25/16*    (2006.01)
   *H01L 23/495*    (2006.01)
   *H01L 21/48*    (2006.01)
   *H01L 21/56*    (2006.01)
   *H01L 23/31*    (2006.01)

(52) U.S. Cl.
CPC .... *H01L 23/49548* (2013.01); *H01L 21/4825* (2013.01); *H01L 21/4842* (2013.01); *H01L 21/565* (2013.01); *H01L 23/3114* (2013.01); *H01L 23/4952* (2013.01); *H01L 23/49503* (2013.01); *H01L 23/49537* (2013.01); *H01L 23/49541* (2013.01); *H01L 23/49575* (2013.01); *H01L 23/49579* (2013.01); *H01L 2224/48247* (2013.01); *H01L 2224/4903* (2013.01); *H01L 2924/19107* (2013.01)

(58) Field of Classification Search
None
See application file for complete search history.

(56) References Cited

U.S. PATENT DOCUMENTS

| | | | | |
|---|---|---|---|---|
| 5,202,577 A | * | 4/1993 | Ichigi | H01L 21/4842 257/666 |
| 2004/0026770 A1 | * | 2/2004 | Tsuchida | H01L 23/49562 257/686 |
| 2005/0231925 A1 | * | 10/2005 | Fukuda | H01L 24/49 361/760 |
| 2007/0075419 A1 | * | 4/2007 | Fukuda | H01L 23/49568 257/717 |
| 2009/0212284 A1 | * | 8/2009 | Otremba | H01L 23/4952 257/48 |
| 2012/0108013 A1 | * | 5/2012 | Fujisawa | H01L 21/4842 438/123 |
| 2013/0249071 A1 | * | 9/2013 | Yao | H01L 21/4842 257/676 |

FOREIGN PATENT DOCUMENTS

CN    204 651 308 U    9/2015

* cited by examiner

*Primary Examiner* — Joseph C. Nicely
*Assistant Examiner* — Lamont B Koo
(74) *Attorney, Agent, or Firm* — Dicke, Billig & Czaja, PLLC (57) ABSTRACT

An electronic device and method is disclosed. In one example, the electronic device includes a semiconductor chip and a leadframe. The leadframe includes a first class of leads and a second class of leads. The leads of the second class of leads are thinner than leads of the first class of leads.

17 Claims, 5 Drawing Sheets

ELECTRONIC DEVICE, LEADFRAME FOR AN ELECTRONIC DEVICE AND METHOD FOR FABRICATING AN ELECTRONIC DEVICE AND A LEADFRAME

CROSS-REFERENCE TO RELATED APPLICATION

This Utility Patent Application claims priority to German Patent Application No. 10 2017 209 904.6, filed Jun. 13, 2017, which is incorporated herein by reference.

TECHNICAL FIELD

This disclosure relates in general to an electronic device, a leadframe for an electronic device, to a method for fabricating an electronic device and a method for fabricating a leadframe.

BACKGROUND

A leadframe such as a leadframe for an electronic device may have to fulfil certain conflicting requirements, for example the ability to deal with a particular electrical current or voltage and at the same time to have sufficiently small dimensions such that the leadframe fits into a particular semiconductor package. A high voltage or a high electrical current may require the use of a leadframe with large dimensions which may limit the number of leads or outer terminals that fit into the semiconductor package. It may therefore not be possible to include all the desired functionality into a package of a given size because the package may be too small for the required number of outer terminals.

For these and other reasons, there is a need for an improved leadframe.

SUMMARY

Various aspects pertain to an electronic device comprising a semiconductor chip and a leadframe comprising a first class of leads and a second class of leads. The leads of the second class of leads are thinner than leads of the first class of leads.

Various aspects pertain to a leadframe for an electronic device comprising a first leadframe part comprising a first class of leads. The leadframe further comprises a second leadframe part comprising a second class of leads. The leads of the second class of leads are thinner than leads of the first class of leads.

Various aspects pertain to a method for fabricating an electronic device, the method comprising providing a semiconductor component and providing a leadframe. The leadframe comprises a first leadframe part comprising a first class of leads and a second leadframe part comprising a second class of leads. The method further comprises connecting the semiconductor component to one or more of the first class of leads and the second class of leads. The leads of the second class of leads are thinner than leads of the first class of leads.

Various aspects pertain to a method of fabricating a leadframe for an electronic device. The method comprises forming a leadframe comprising a frame and a first leadframe part. The first leadframe part comprises a first class of leads, the leads of the first class of leads being integral with the frame. The method further comprises forming a second leadframe part comprising a second class of leads. The leads of the second class of leads are thinner than leads of the first class of leads. The forming comprises one or more of reducing the thickness of an integral part of the leadframe to form the second leadframe part, or separately forming the second leadframe part and fixing the second leadframe part to the frame.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings. It may be evident, however, to one skilled in the art that one or more aspects of the disclosure may be practiced with a lesser degree of the specific details. In other instances, known structures and elements are shown in schematic form in order to facilitate describing one or more aspects of the disclosure. In this regard, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration and is in no way limiting. It is to be understood that other examples may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense, and the scope of the present invention is defined by the appended claims.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The electronic devices described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

The electronic devices described below may comprise an encapsulation body encapsulating the semiconductor chip(s) of the electronic device. The encapsulation body may comprise any suitable material, for example an electrically insulating material, a polymer, a plastic, a mold, an epoxy or a laminate. An electronic device may further comprise a leadframe.

The electronic devices described below may be surface mounted devices (SMD), through-hole devices (THD), dual in-line packages (DIP), quad flat packages (QFP), quad flat no-leads packages (QFN) etc. In the context of this application, the term "lead" denotes a part of a leadframe that is configured to act as an (outer) terminal of an electronic device. In this context, a lead does not have to "stick out" of the outline of the encapsulation body of the electronic device. A QFN is an example for an electronic device, wherein the outer terminals do not stick out. Of course, a lead may also stick out, like for example in a QFP.

A leadframe for an electronic device may comprise one or more carrier portion(s) and one or more terminal portion(s). The carrier portion(s) may be configured to carry one or more semiconductor chips, i.e. may serve as die pad(s). The terminal portion(s) may comprise leads, that is segments that are configured to act as (outer) leads of an electronic device like a semiconductor package. Individual leads of an electronic device may be configured to fulfil different functions, for example act as power pins, input/output (I/O) pins, gate pins, voltage sensing pins, thermal sensing pins, etc.

A leadframe may comprise any suitable material, for example a metal material. A leadframe may e.g. comprise Al, Au, Cu, Fe, Ni, P, or NiP. A leadframe may comprise a core and a coating, for example a Cu core and a NiP coating. The meaning of the term "metal material" of a specific metal (e.g. Cu) also comprises metal alloys of the specific metal (e.g. Cu alloys).

A leadframe may comprise a first class of leads and a second class of leads. Leads of the second class of leads may be thinner than leads of the first class of leads. Further, leads of the second class of leads may have, e.g., a pitch that is smaller than a pitch of leads of the first class of leads.

Figure 1A:
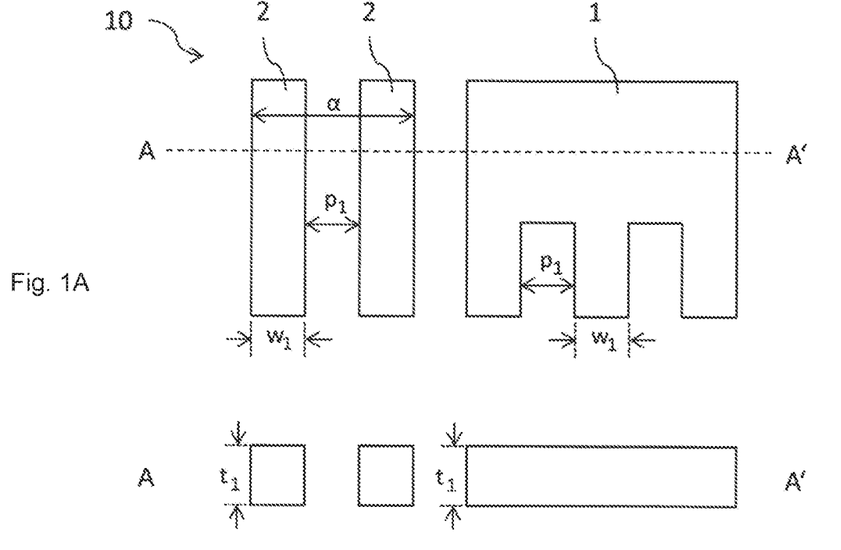
FIG. 1A schematically shows a top down view and a cross section view of a conventional leadframe.

FIG. 1A shows in its upper part a top view of a conventional leadframe 10 comprising first leads 1 and second leads 2. The lower part of FIG. 1A shows a cross section along the line A-A'.

The first and second leads 1, 2 are arranged coplanar. The first and second leads 1, 2 have an identical thickness $t_1$ (measured perpendicular to the common plane of the first and second leads 1, 2) and an identical pitch $p_1$ (measured along the common plane). The first and second leads 1, 2 may also have an identical width $w_1$ (measured along the common plane). The first leads 1 may have a uniform thickness. The second leads 2 may have a uniform thickness.

For example, $t_1$ may be equal to or greater or less than 0.2 mm, 0.25 mm, 0.3 mm, 0.4 mm, 0.5 mm, 0.6 mm or even greater than 0.6 mm. $p_1$ may be about 0.2 mm, 0.25 mm, 0.3 mm, 0.4 mm, 0.5 mm, 0.6 mm or even greater than 0.6 mm. $w_1$ may be about 0.2 mm, 0.25 mm, 0.3 mm, 0.4 mm, 0.5 mm, 0.6 mm, 0.7 mm, 0.8 mm, 0.9 mm, 1 mm or even greater than 1 mm.

According to an example, the first leads 1 are configured to be connected to a power electrode of a semiconductor chip, for example a source electrode or a drain electrode. According to an example, the second leads 2 are configured to be connected to one or more of an I/O electrode, a control electrode like a gate electrode and a sensor, in particular a thermal sensor.

Figure 1B:
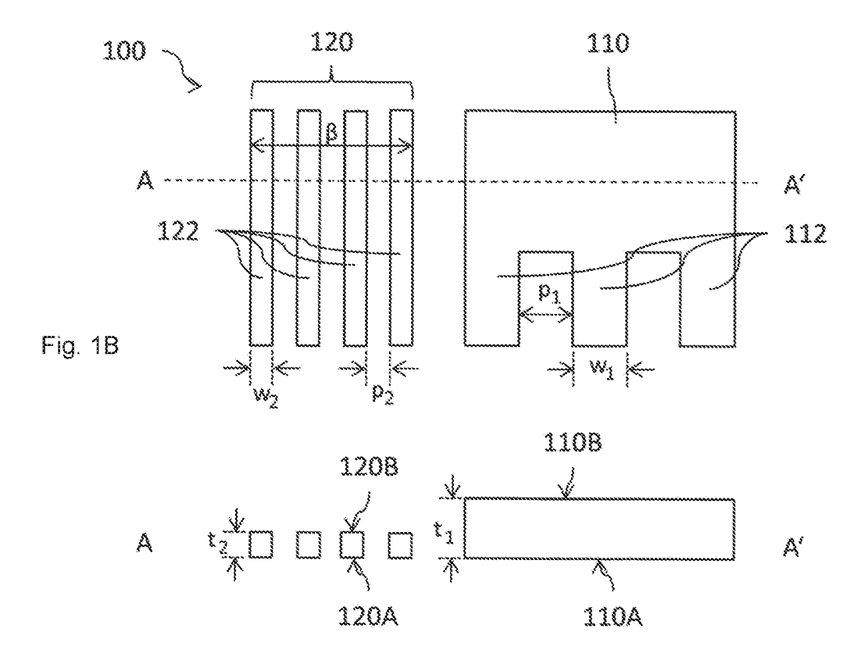
FIG. 1B schematically shows a top down view and a cross section view of an exemplary leadframe according to the disclosure.

FIG. 1B shows in its upper part a top view of a leadframe 100, wherein leadframe 100 may be identical to leadframe 10 except for the differences described in the following. The lower part of FIG. 1B shows a cross section along the line A-A'. The leadframe 100 may be configured to be part of an electronic device like a semiconductor package.

The leadframe 100 comprises a first class of leads 110 and a second class of leads 120. The first class of leads 110 may be identical to the first leads 1 of leadframe 10. The second class of leads 120 may be identical to the first class of leads 110 except that the second class of leads has a smaller thickness $t_2$ than the first class of leads 110. The second class of leads 120 may further have, e.g., a smaller pitch $p_2$ and/or a smaller width $w_2$ than the first class of leads 110. Since the leadframe 100 comprises two different classes of leads, it may be termed a "hybrid" leadframe.

The leadframe 100 may include additional components which are not shown in FIG. 1B. For example, the leadframe 100 may comprise a chip carrier and a frame connecting to the first class of leads 110, the second class of leads 120 and the chip carrier. During fabrication of an electronic device the first and second classes of leads 110, 120 and the chip carrier may be removed from the frame. Herein, a "frame" may be a part of a leadframe that is not integrated into an electronic device but is only used to hold other parts of the leadframe, for example chip carriers or leads.

A minimum value of $p_2$ may depend on the value of $t_2$. For example, the minimum value of $p_2$ may be equal to or less than 70%, or 80%, or 90%, or 100% of $t_2$. This relationship may depend on the fabrication process used to fabricate the leads of the leadframe 100. For example, if a stamping process is used to fabricate the leads then the minimum pitch may be about 80% of the lead thickness.

For example, $t_2$ may be equal to or greater than 0%, or 10%, or 20%, or 30%, or 40%, or 50%, or 60%, or 70%, or 80% smaller than $t_1$. $p_2$ may be equal to or greater than 0%, or 10%, or 20%, or 30%, or 40%, or 50%, or 60%, or 70%, or 80% smaller than $p_1$. $w_2$ may be equal to or greater than 0%, or 10%, or 20%, or 30%, or 40%, or 50%, or 60%, or 70%, or 80% smaller than $w_1$. $t_2$ may be equal to or less than about 0.1 mm, 0.2 mm, 0.25 mm, 0.3 mm, 0.4 mm, 0.5 mm, 0.6 mm, 0.6 mm or even greater than 0.7 mm. $p_2$ may be equal to or less than about 0.1 mm, 0.2 mm, 0.25 mm, 0.3 mm, 0.4 mm, 0.5 mm, 0.6 mm or even greater than 0.6 mm. $w_2$ may be equal to or less than about 0.1 mm, 0.2 mm, 0.25 mm, 0.3 mm, 0.4 mm, 0.5 mm, 0.6 mm, 0.7 mm, 0.8 mm, 0.9 mm, 1 mm or even greater than 1 mm.

According to an example of a leadframe 100, $w_1$, $t_1$ and $p_1$ may be 0.8 mm, 0.5 mm and 0.4 mm, respectively, and $w_2$, $t_2$ and $p_2$ may be 0.25 mm, 0.25 mm and 0.25 mm, respectively.

In FIG. 1B the first class of leads 110 is shown to comprise three leads 112 and the second class of leads 120 is shown to comprise four leads 122. However, according to other examples the leadframe 100 may comprise any suitable number of leads of the first class of leads 110 and of the second class of leads 120. According to an example, the leads 112 of the first class of leads 110 need not necessarily be electrically connected to one another as shown in FIG. 1B, but may be electrically insulated from one another and may be configured to be coupled to different electrodes of a semiconductor chip (not shown) or to different semiconductor chips.

The first class of leads 110 and the second class of leads 120 may be arranged coplanar. For example, the lower surfaces 110A, 120A of the first and second class of leads 110, 120 may be arranged in a common plane as shown in FIG. 1B. According to an example, the leadframe 100 is configured such that one or more semiconductor chips may be mechanically and/or electrically coupled to the upper surfaces 110B, 120B (that is, those surfaces that are not coplanar). According to another example, the leadframe 100 is configured such that one or more semiconductor chips may be mechanically and/or electrically coupled to the lower surfaces 110A, 120A (that is, the coplanar surfaces).

The first and second classes of leads 110, 120 may comprise the same material composition or may comprise different material compositions.

The first class of leads 110 may be configured to act as, e.g., power terminals of a semiconductor package and the second class of leads 120 may be configured to act as, e.g., I/O terminals of the semiconductor package. The second class of leads 120 may be configured to withstand a smaller electrical current or a smaller voltage than the first class of leads 110 and may therefore have a smaller minimum thickness and/or minimum pitch.

Since $p_2$ is smaller than $p_1$ and/or $w_2$ is smaller than $w_1$, the length α in FIG. 1A may be equal to or longer than the length β in FIG. 1B. In other words, using the second class of leads 120 with smaller pitch and/or smaller width, it may be possible to increase the overall number of leads that can be arranged along a given length α. In this manner it is possible to increase the number of leads of an electronic device like a semiconductor package without increasing the package size. The additional leads may, e.g., be used to provide additional I/O terminals, additional control terminals, or additional sensing terminals.

Figure 2A:
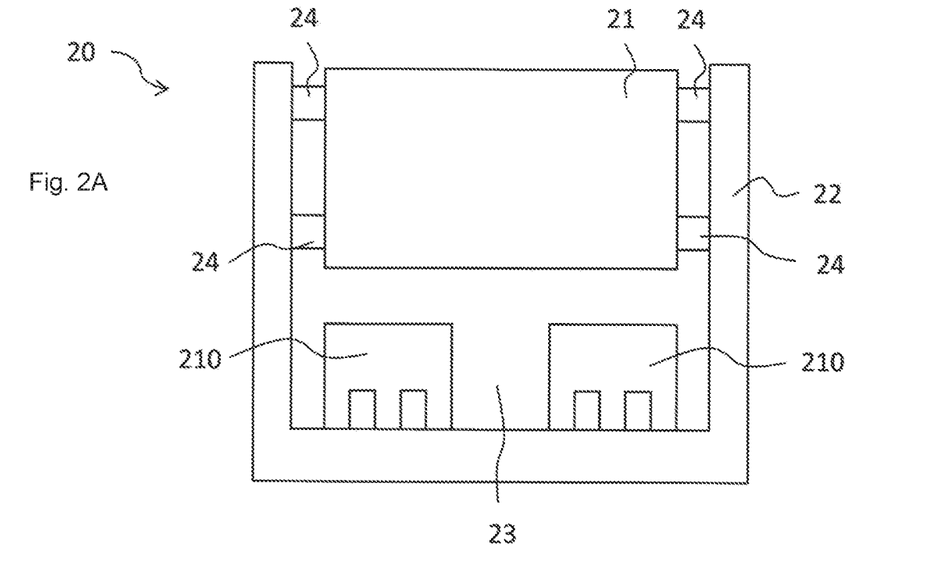
FIGS. 2A and 2B schematically show a bottom up view of a leadframe in different stages of fabrication according to an exemplary method for fabricating a leadframe.

FIG. 2A shows a leadframe 20 comprising a first class of leads 210, a chip carrier 21 and a frame 22. The first class of leads 210 is coupled to the frame 22 and the chip carrier 21 is coupled to the frame 22 by tie-bars 24. The leadframe 20 further comprises a blank 23 suitable for attaching a second class of leads to the frame 22 as described below (herein a "blank" may indicate a specific empty region on the frame 22 that does not comprise any leads).

Figure 2B:
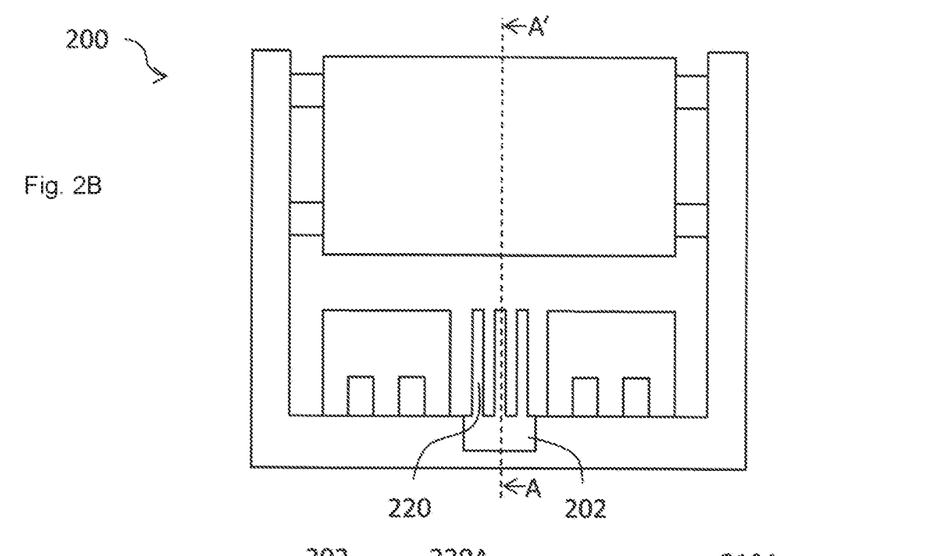

FIG. 2B shows a leadframe part 202 comprising a second class of leads 220 attached to the frame 22 at the blank 23 (compare FIG. 2A). The leadframe part 202 may be a part of a further leadframe (not shown) that comprises leads with pitch $p_2$, thickness $t_2$ and width $w_2$ as described above.

Attaching the leadframe part 202 to the frame 22 may comprise a pick and place process. Attaching the leadframe part 202 to the frame 22 may further comprise a fixing process, for example a welding process, in particular an ultrasonic welding process. A single leadframe part 202 or greater than one leadframe part 202 may be attached to the frame 22. The greater than one leadframe parts 202 may be identical or they may be different and may for example comprise different numbers of leads. The fixing bond (e.g. welding seam) may be formed, e.g., between the horizontally abutting faces of the indentation 204 and the leadframe part 202.

The leadframe part 202 may be attached to the frame 22 prior to arranging a semiconductor component like a semiconductor chip on the chip carrier 21. The leadframe part 202 may be attached to the frame 22 while the frame 22 comprises a multitude of chip carriers and corresponding leads 210. The leadframe part 202 may have the same material composition as the frame 22 or it may have a different material composition. For example, the frame 22 may comprise or consist of a Cu (or Cu alloy) core and a NiP coating and the leadframe part 202 may comprise or consist of Al (or an Al alloy).

Attaching the second class of leads 220 to the leadframe 20 produces a hybrid leadframe 200 comprising a first class of leads 210 and a second class of leads 220, wherein the first and second classes of leads 210, 220 have a different thickness and/or one or more of a different pitch and a different width. The leadframe 200 may be identical to the leadframe 100 and reference numbers of identical features have identical second and third digits.

Figure 2C:
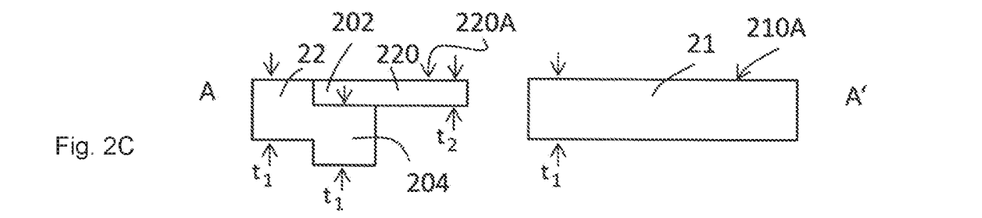
FIG. 2C shows a cross section view of the leadframe of FIG. 2B.

FIG. 2C shows a cross section of the leadframe 200 along the line A-A' in FIG. 2B. The bottom face 220A of the second class of leads 220 may be coplanar with the bottom face 210A of the first class of leads 210 and the bottom face of the chip carrier 21.

The frame 22 may comprise an indentation 204 below the leadframe part 202. The indentation 204 may have an outline that corresponds or matches to an outline of the leadframe part 202 over the frame 22. The indentation 204 may, e.g., have a length measured along the line A-A' of about equal to or greater or less than 200 µm, 300 µm, 400 µm or 500 µm. The indentation 204 may have a step-like shape, wherein the step size may correspond to the thickness $t_2$ of the second class of leads 220. The part of the frame 22 that is arranged below the leadframe part 202 (e.g. the part of the frame 22 that comprises the indentation 204) may be configured to mechanically support the leadframe part 202 and/or to firmly keep the leadframe part 202 in place.

The indentation 204 may be fabricated in the frame 22 in order to make e.g. the bottom surfaces 210A, 220A of the first and second classes of leads 210, 220 coplanar. The indentation 204 may for example be fabricated by stamping. The indentation 204 may be fabricated prior to attaching the leadframe part 202 to the frame 22, or during the attachment process, or after the leadframe part 202 has been attached to the frame 22.

During fabrication of an electronic device, the chip carrier 21 and the leads 210, 220 may be separated from the frame 22, for example by cutting the tie-bars 24 and the leads.

Figure 3A:
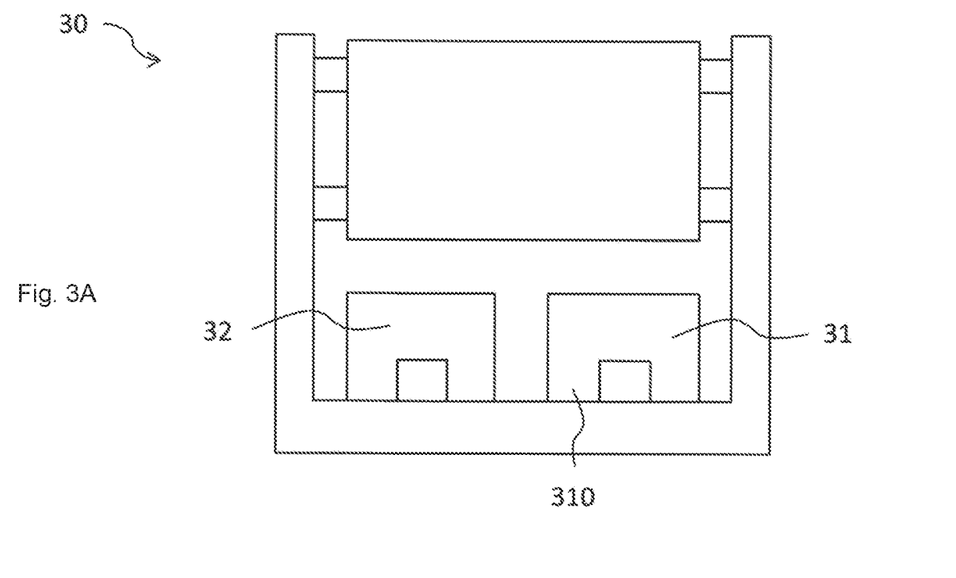
FIGS. 3A and 3B schematically show a bottom up view of a further exemplary leadframe in different stages of fabrication according to another exemplary method for fabricating a leadframe.

FIG. 3A shows a leadframe 30 which may, e.g., be identical to the leadframe 20. However, according to an example the blank 23 may be missing in the leadframe 30 because it may not be needed here. Leadframe 30 may comprise a first leadframe part 31 and a second leadframe part 32. The first and second leadframe parts 31, 32 may comprise leads, for example leads 310 of the first class of leads. According to an example, the leads of the first and second leadframe parts 31, 32 may be identical. According to another example, the first and second leadframe parts 31, 32 may be different and may for example have a different shape or comprise a different number of leads. The leads of the first and second leadframe parts 31, 32 may have the thickness $t_1$, width $w_1$ and pitch $p_1$.

The leadframe 30 may not be suitable for certain applications, for example, it may comprise an insufficient number of leads or it may comprise leads with too large a width, too large a thickness, or too large a pitch. Therefore, leadframe 30 may be processed into a hybrid leadframe by fabricating the second class of leads (e.g. with $t_2$, $w_2$ and $p_2$) out of the first leadframe part 31 or the second leadframe part 32 (in the following, without loss of generality, the second leadframe part 32 is used). In other words, instead of attaching a separate leadframe part comprising the second class of leads to the frame 22 as shown in FIG. 2B, the hybrid leadframe may be formed by processing (e.g. thinning) leads of the first class of leads that are already attached to the frame.

Fabricating the second class of leads out of the second leadframe part 32 may comprise an act of thinning the second leadframe part 32. The act of thinning may comprise one or more of hammering, milling, grinding and etching the second leadframe part 32. Hammering may for example comprise a single stroke or multiple strokes (e.g. two strokes or three strokes) in order to fabricate the second class of leads.

Fabricating the second class of leads out of the second leadframe part 32 may comprise an act of removing excess material from the second leadframe part 32. According to an example, the act of removing excess material may be performed after the act of thinning and according to another example it may be performed concurrently with the act of thinning. The act of removing excess material may comprise one or more of cutting, milling, grinding and etching the second leadframe part 32.

According to an example, fabricating the second class of leads comprises hammering the second leadframe part 32 in order to reduce the thickness from $p_1$ to $p_2$ and then cutting away excess material in order to reduce the width from $w_1$ to $w_2$, to reduce the pitch from $p_1$ to $p_2$ and/or to increase the number of leads (e.g. from two to four).

According to an example, the second leadframe part 32 may be a workable part that is specifically designed to be fabricated into leads of the second class of leads. The workable part may for example comprise a specific shape that can readily be hammered, stamped, milled, ground, etched, cut, etc. For example, the workable part may have a rectangular shape. According to another example, the second leadframe part 32 may be identical to the first leadframe part 31 as e.g. shown in FIG. 3A.

Figure 3B:
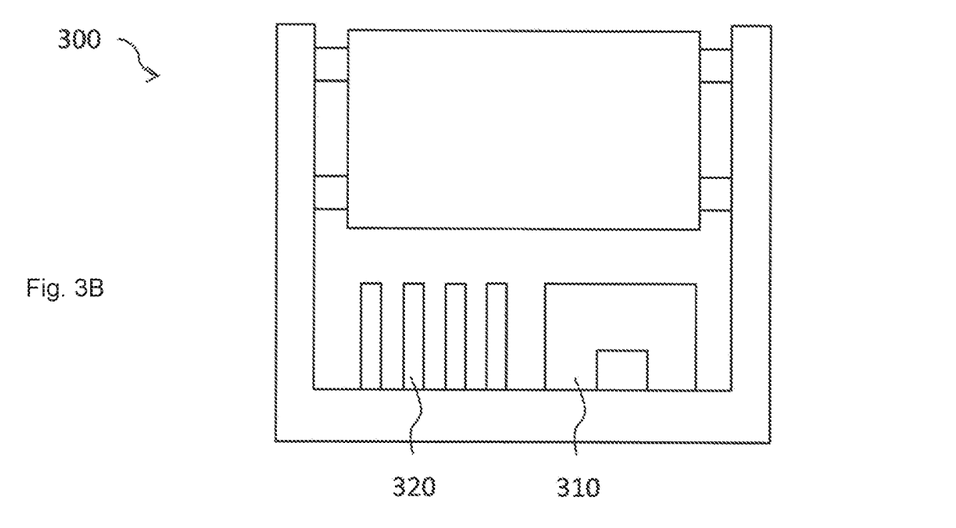

FIG. 3B shows an example of a hybrid leadframe 300 which may be obtained from the leadframe 30 by fabricating leads 320 of the second class of leads out of the second leadframe part 32. The only difference between the leadframes 200 and 300 may be that in leadframe 300 both the first class of leads 310 and the second class of leads 320 are integral parts of the frame 322, whereas in leadframe 200 only the first class of leads 210 is an integral part of the frame 22.

Figure 4:
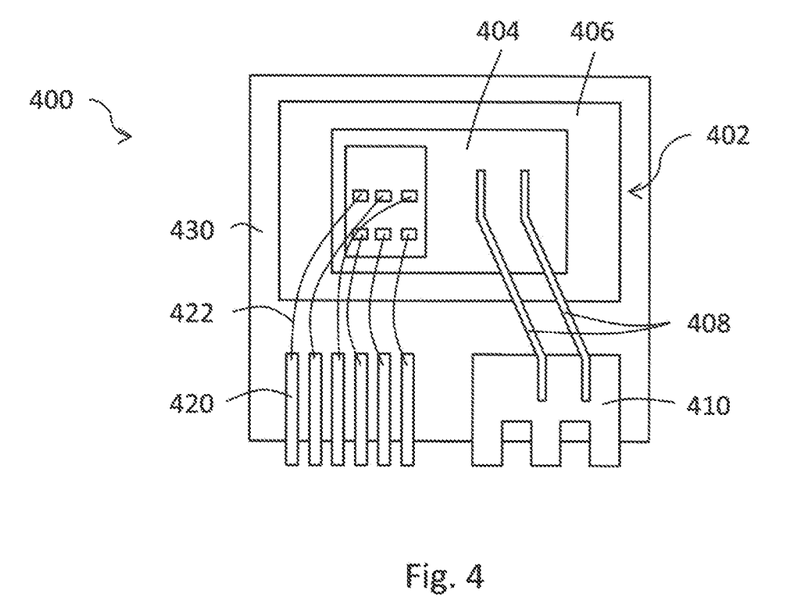
FIG. 4 schematically shows a top down view of an exemplary electronic device that includes a leadframe.

FIG. 4 shows an electronic device 400 comprising a hybrid leadframe 402 like the leadframes 100, 200, or 300 and a first semiconductor component 404 which is, e.g., a first semiconductor chip. The first semiconductor component 404 may be arranged on a chip carrier 406 (corresponding e.g. to carrier 21) of the leadframe 402 (corresponding e.g. to leadframe 200 or 300) and it may be electrically connected to a first class of leads 410 (which may, e.g., be identical to the leads 110, 210, or 310) of the leadframe 402 by one or more first connection elements 408. The first connection elements 408 may, e.g., comprise bonding wires or contact clips. The first connection elements 408 may electrically connect a first electrode (not shown), e.g. a first load electrode such as a drain/collector or source/emitter electrode of the first semiconductor component 404 to the first class of leads 410.

The leadframe 402 further comprises a second class of leads 420 (which may be identical to the leads 120, 220, or 320). One or more further electrodes of the first semiconductor component 404, e.g. a gate electrode or a voltage sensing electrode, may be electrically connected to the second class of leads 420 by second connection elements 422. Furthermore, one or more further semiconductor components (e.g. further semiconductor chips) of the electronic device 400 may be electrically connected to the second class of leads 420 by the second connection elements 422. The second connection elements 422 may, e.g., comprise bonding wires or other suitable electrical connectors.

According to an example of an electronic device 400, the first semiconductor component 404 comprises a power semiconductor chip of which a load electrode is coupled to the first class of leads 410 and a further semiconductor component comprises a driver circuit for driving the power semiconductor chip and/or a temperature sensor which is/are coupled to the second class of leads 420.

The electronic device 400 may further comprise an encapsulation body 430 encapsulating the semiconductor component(s). The first class of leads 410 and the second class of leads 420 may form outer (external) terminals of the electronic device 400 that are exposed from the encapsulation body 430.

Figure 5:
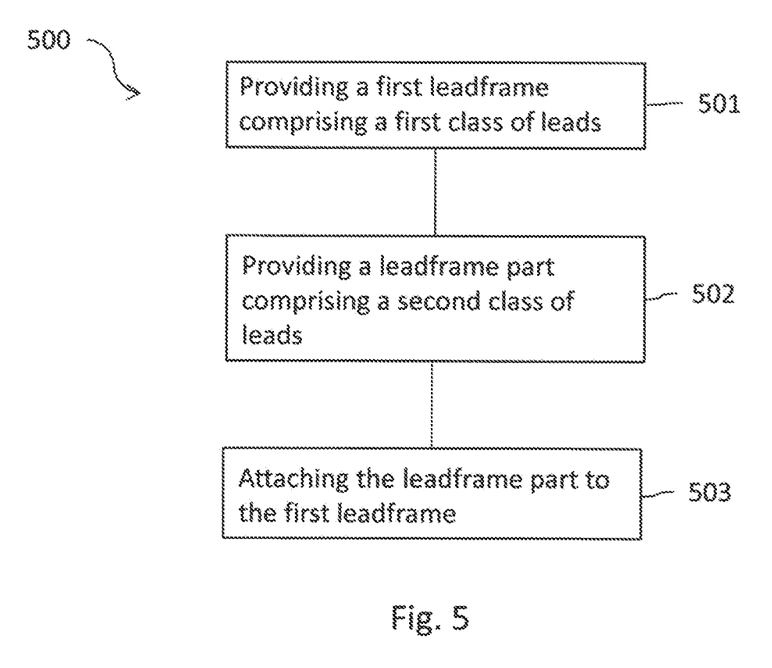
FIG. 5 shows a flow diagram of an exemplary method for fabricating a leadframe.

FIG. 5 shows a flow diagram of a method 500 for fabricating a leadframe like e.g. the leadframe 200. At 501 a first leadframe comprising a first class of leads is provided, at 502 a leadframe part comprising a second class of leads is provided and at 503 the leadframe part is attached to the first leadframe. The leadframe part may be attached to a frame part of the first leadframe.

According to an example, the first leadframe may be the leadframe 20 and the leadframe part may be the leadframe part 202. The leadframe part may be arranged on the first leadframe and attached to the first leadframe as described with respect to FIG. 2B.

Figure 6:
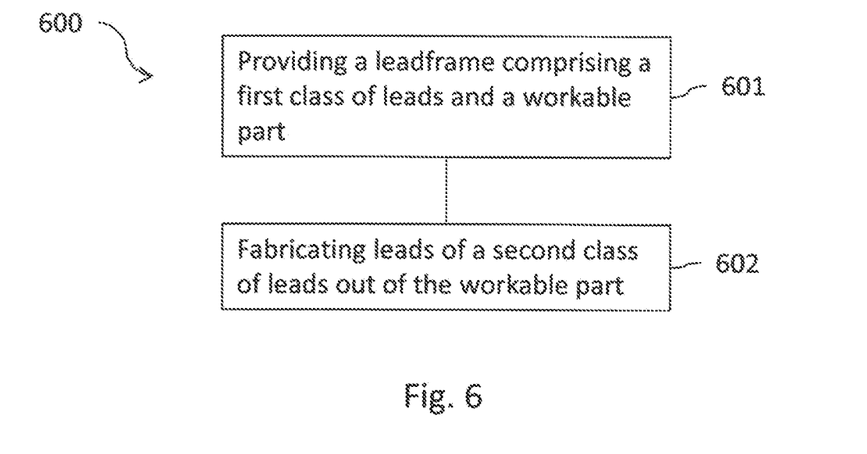
FIG. 6 shows a flow diagram of a further exemplary method for fabricating a leadframe.

FIG. 6 shows a flow diagram of a method 600 for fabricating a leadframe like the leadframe 300. At 601 a leadframe comprising a first class of leads and a workable part are provided. At 602 leads of a second class of leads are fabricated out of the workable part. Fabricating the second class of leads may be done as described with respect to FIGS. 3A and 3B.

Figure 7:
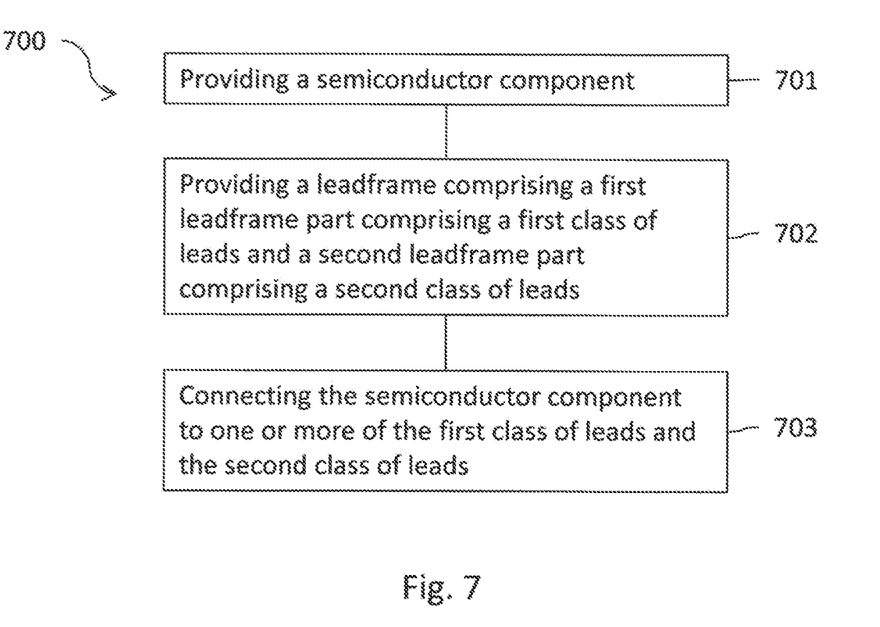
FIG. 7 shows a flow diagram of an exemplary method for fabricating an electronic device.

FIG. 7 shows a flow diagram of a method 700 for fabricating an electronic device like the electronic device 400. At 701 a semiconductor component is provided and at 702 a leadframe comprising a first leadframe part comprising a first class of leads and a second leadframe part comprising a second class of leads is provided. At 703 the semiconductor component is connected to one or more of the first class of leads and the second class of leads.

Providing the semiconductor component at 701 may comprise providing one or more semiconductor chips. Providing the leadframe at 702 may comprise fabricating the leadframe according to, e.g., method 500 or 600. Connecting the semiconductor component at 703 may comprise connecting a first semiconductor chip to the first class of leads and connecting a second semiconductor chip to the second class of leads. Connecting the semiconductor component at 703 may comprise connecting a load electrode of a first semiconductor chip to the first class of leads and connecting a further electrode like, e.g., a gate electrode or a sensing electrode of the first semiconductor chip to the second class of leads.

The method 700 may further comprise forming an encapsulation body encapsulating the semiconductor component. The leads of the first and second classes of leads may be exposed at a periphery of the encapsulation body and may form outer terminals of the electronic device.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. An electronic device, comprising:
   a semiconductor chip, and
   a leadframe comprising a first class of leads and a second class of leads,
   wherein a thickness of leads of the second class of leads is smaller than a thickness of leads of the first class of leads in a direction perpendicular to a common plane of the first class of leads and the second class of leads, wherein an encapsulation body encapsulates the semiconductor die, wherein a pitch of the leads of the second class of leads exterior to the encapsulation body is smaller than a pitch of the leads of the first class of leads exterior to the encapsulation body, wherein the first class of leads and the second class of leads are arranged to be coplanar, wherein a pitch of the leads of the second class of leads is equal to or less than 80% of the thickness of the leads of the second class of leads.

2. The electronic device of claim 1, wherein the leads of the second class of leads are equal to or greater than 50% thinner than the leads of the first class of leads.

3. The electronic device of claim 1, wherein the leads of the second class of leads are equal to or greater than 20% thinner than the leads of the first class of leads.

4. The electronic device of claim 1, wherein the leads of the second class of leads have the thickness of equal to or less than 0.4 mm.

5. The electronic device of claim 1, wherein the second class of leads comprises one or more of an I/O terminal, a gate terminal, a voltage sensing terminal and a temperature sensing terminal of the electronic device.

6. A leadframe for an electronic device, comprising:
   a first leadframe part comprising a first class of leads, and
   a second leadframe part comprising a second class of leads,
   wherein a thickness of leads of the second class of leads is smaller than a thickness of leads of the first class of leads in a direction perpendicular to a common plane of the first class of leads and the second class of leads, wherein the leads of the first and second class of leads are arranged to be coplanar, wherein the leadframe further comprises a frame that includes an indentation, wherein the second leadframe part is fixed to the indentation within the frame, and wherein a pitch of the leads of the second class of leads is equal to or less than 80% of the thickness of the leads of the second class of leads.

7. The leadframe of claim 6, wherein the leads of the first and second class of leads are arranged coplanar.

8. The leadframe of claim 6, wherein the first and second leadframe parts have different material compositions.

9. The leadframe of claim 6, wherein the second leadframe part is welded to the frame.

10. An electronic device, comprising:
    a semiconductor chip, and
    a leadframe comprising a first class of leads and a second class of leads,
    wherein a thickness of leads of the second class of leads is smaller than a thickness of leads of the first class of leads in a direction perpendicular to a common plane of the first class of leads and the second class of leads, wherein an encapsulation body encapsulates the semiconductor die, wherein a pitch of the leads of the second class of leads exterior to the encapsulation body is smaller than a pitch of the leads of the first class of leads exterior to the encapsulation body, wherein the first class of leads and the second class of leads are arranged to be coplanar, and wherein the second class of leads comprises one or more of an I/O terminal, a gate terminal, a voltage sensing terminal and a temperature sensing terminal of the electronic device.

11. The electronic device of claim 10, wherein the leads of the second class of leads are equal to or greater than 50% thinner than the leads of the first class of leads.

12. The electronic device of claim 10, wherein the leads of the second class of leads are equal to or greater than 20% thinner than the leads of the first class of leads.

13. The electronic device of claim 10, wherein the leads of the second class of leads have the thickness of equal to or less than 0.4 mm.

14. A leadframe for an electronic device, comprising:
    a first leadframe part comprising a first class of leads, and
    a second leadframe part comprising a second class of leads,
    wherein a thickness of leads of the second class of leads is smaller than a thickness of leads of the first class of leads in a direction perpendicular to a common plane of the first class of leads and the second class of leads, wherein the leads of the first and second class of leads are arranged to be coplanar, wherein the leadframe further comprises a frame that includes an indentation, wherein the second leadframe part is fixed to the indentation within the frame, and wherein the second class of leads comprises one or more of an I/O terminal, a gate terminal, a voltage sensing terminal and a temperature sensing terminal of the electronic device.

15. The leadframe of claim 14, wherein the leads of the first and second class of leads are arranged coplanar.

16. The leadframe of claim 14, wherein the first and second leadframe parts have different material compositions.

17. The leadframe of claim 14, wherein the second leadframe part is welded to the frame.

* * * * *